United States Patent
Lie et al.

(10) Patent No.: US 7,205,835 B1
(45) Date of Patent: Apr. 17, 2007

(54) SWITCHING MODE POWER AMPLIFIER HAVING INCREASED POWER EFFICIENCY

(75) Inventors: Donald Y. C. Lie, San Diego, CA (US); Jeremy Popp, Annapolis, MD (US)

(73) Assignee: United States of America as represented by the Secretary of the Navy, Washington, DC (US)

( * ) Notice: Subject to any disclaimer, the term of this patent is extended or adjusted under 35 U.S.C. 154(b) by 142 days.

(21) Appl. No.: 11/064,188

(22) Filed: Feb. 23, 2005

(51) Int. Cl.
*H03F 3/217* (2006.01)

(52) U.S. Cl. .................... 330/251; 330/207 A
(58) Field of Classification Search ........ 330/251, 330/207 A
See application file for complete search history.

(56) References Cited

U.S. PATENT DOCUMENTS

| | | | |
|---|---|---|---|
| 3,919,656 A * | 11/1975 | Sokal et al. ............ 330/51 |
| 4,827,275 A * | 5/1989 | Fusinski ............... 343/726 |
| 6,778,018 B2 * | 8/2004 | Joly et al. ............. 330/296 |
| 6,949,978 B2 * | 9/2005 | Tayrani et al. ......... 330/251 |
| 7,076,009 B2 * | 7/2006 | Wieck ................. 375/345 |
| 7,098,737 B2 * | 8/2006 | Fujimoto et al. ....... 330/283 |

* cited by examiner

*Primary Examiner*—Patricia Nguyen
(74) *Attorney, Agent, or Firm*—Allan Y. Lee; Michael A. Kagan; Peter A. Lipovsky

(57) ABSTRACT

An increased power efficient switching mode power amplifier system. The system includes a SMPA and an E/S reactive component. The SMPA includes a transistor, an RF choke and a tank circuit. The transistor has an emitter/source and is capable of receiving an input signal. The RF choke is operatively coupled to the transistor. The tank circuit is operatively coupled to the RF choke and the transistor. The E/S reactive component is operatively coupled to the emitter/source of the transistor of the SMPA. The E/S reactive component has a desired E/S degeneration reactive component value. A method for an increased power efficient switching mode power amplifier system is also described.

12 Claims, 3 Drawing Sheets

SWITCHING MODE POWER AMPLIFIER HAVING INCREASED POWER EFFICIENCY

FEDERALLY SPONSORED RESEARCH AND DEVELOPMENT

The Switching Mode Power Amplifier Having Increased Power Efficiency is assigned to the United States Government and is available for licensing for commercial purposes. Licensing and technical inquiries should be directed to the Office of Patent Counsel, Space and Naval Warfare Systems Center, San Diego, Code 20012, San Diego, Calif., 92152; voice (619) 553-3001; fax (619) 553-3821. Reference Navy Case Number 96284.

BACKGROUND

The patent application is generally in the field of switching mode power amplifiers (SMPA).

Typical SMPA include pre-packaged transistors having fixed emitter/source degeneration inductance values, which greatly increases the probability of reduced power efficiency.

A need exists for SMPA having increased power efficiency.

DETAILED DESCRIPTION

Described herein is Switching Mode Power Amplifier Having Increased Power Efficiency.

Definitions

The following definitions and acronyms are used herein:

Acronym(s):

SMPA—Switching Mode Power Amplifier(s)

IPE—Increased Power Efficiency

RF—Radio Frequency

DC—Direct Current

Definition(s):

Switching Mode Power Amplifier—An amplifier that uses active devices as switching devices. The switching devices are used to control current and voltage so overlap is greatly reduced across the amplifier. Reducing overlap of current and voltage across the amplifier reduces energy dissipation in the active devices, which increases DC to RF power conversion efficiency.

The increased power efficiency (IPE) SMPA includes a transistor and an emitter/source (E/S) reactive component that is capable of producing a desired E/S degeneration inductance value. The E/S reactive component is operatively coupled to an emitter/source of a bipolar/uni-polar transistor. In one embodiment, the E/S reactive component is operatively coupled to an emitter of a bipolar transistor. In one embodiment, the E/S reactive component is operatively coupled to a source of a uni-polar transistor. In one embodiment, the E/S reactive component comprises an inductor. In one embodiment, the IPE SMPA provides increased power efficiency. Exemplary applications of IPE SMPA include portable wireless communication devices such as Bluetooth-enabled devices, wireless sensor networks, wireless LAN, RF keyless entry systems and RFID systems, where the linearity requirement of the power amplifiers is not strict (e.g., constant envelope modulation schemes).

Figure 1:
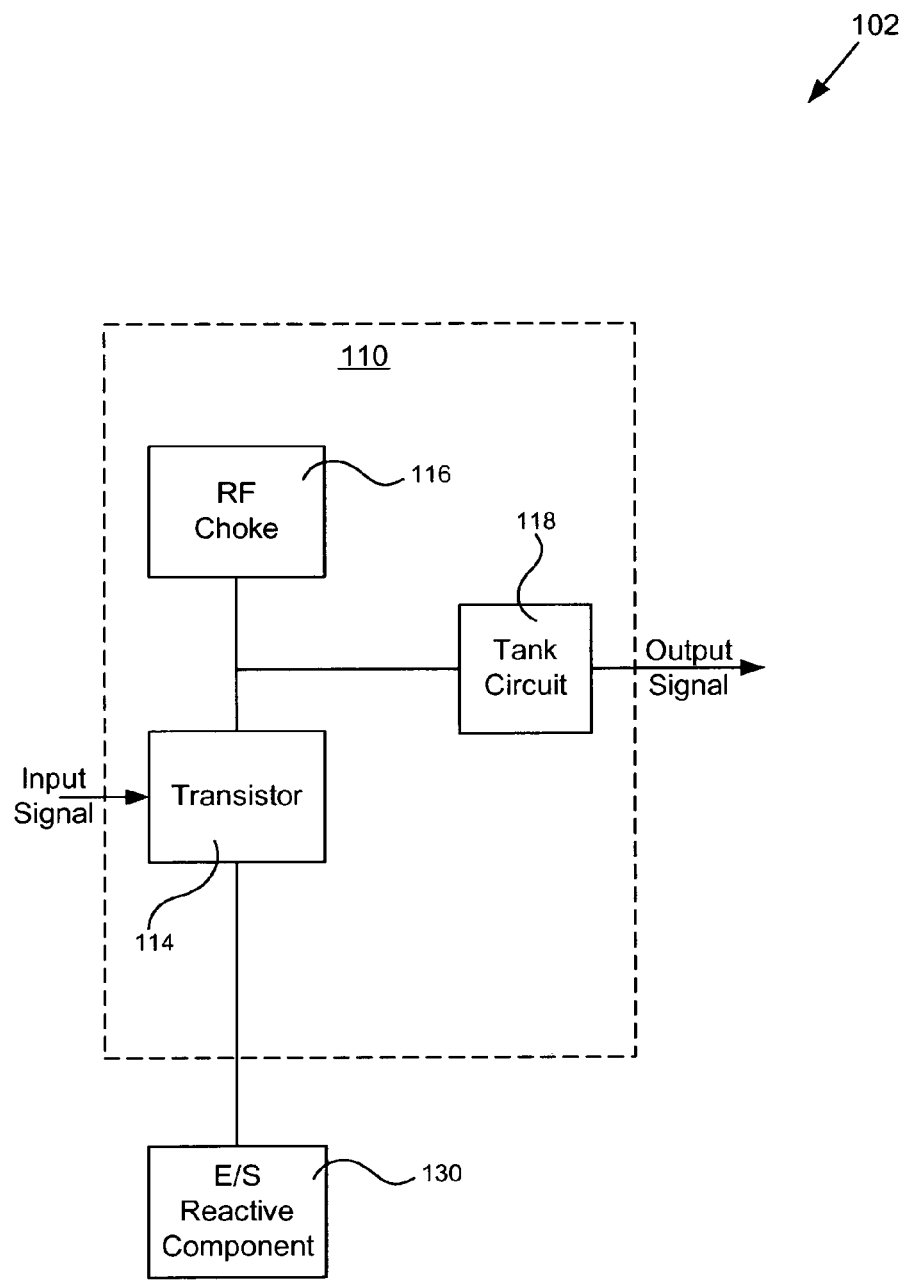
FIG. 1 is a block diagram of one embodiment of a SMPA.

FIG. 1 is a block diagram of one embodiment of an IPE SMPA. As shown in FIG. 1, IPE SMPA 102 includes SMPA 110 and E/S reactive component 130. SMPA 110 receives an input signal and transmits an output signal. SMPA 110 is operatively coupled to E/S reactive component 130. SMPA 110 includes transistor 114, RF choke 116 and tank circuit 118. Transistor 114 is capable of receiving an input signal and outputting the input signal. Transistor 116 is operatively coupled to RF choke 116, tank circuit 118 and E/S reactive component 130. RF choke 116 provides SMPA 110 with a relatively constant current across a frequency cycle from the power supply (not shown in FIGS). RF choke 116 has sufficient impedance to help prevent loading of SMPA 110. Tank circuit 118 shapes the input signal from transistor 114 and produces an output signal. Tank circuit 118 provides a resonant filtering function that allows the output voltage signal to mainly comprise a fundamental frequency. Tank circuit 118 also provides a phase shift, if necessary, which helps deliver current and voltage in phase to an amplifier load.

E/S reactive component 130 is operatively coupled to an emitter/source of transistor 114 and a power supply terminal (not shown in FIGURES). In a bipolar transistor embodiment, E/S reactive component 130 is operatively coupled to an emitter of transistor 114. In a uni-polar transistor embodiment, E/S reactive component 130 is operatively coupled to a source of transistor 114. In one embodiment, E/S reactive component 130 is operatively coupled between an emitter/source of transistor 114 and a negative power supply terminal. E/S reactive component 130 is fabricated or selected to produce a desired E/S degeneration reactive component value. E/S reactive component 130 can comprise a complex impedance fabricated or selected to increase SMPA power efficiency. In one embodiment, E/S reactive component 130 comprises an inductor. In one embodiment, E/S reactive component 130 comprises a parallel combination of inductors and capacitors.

Figure 2:
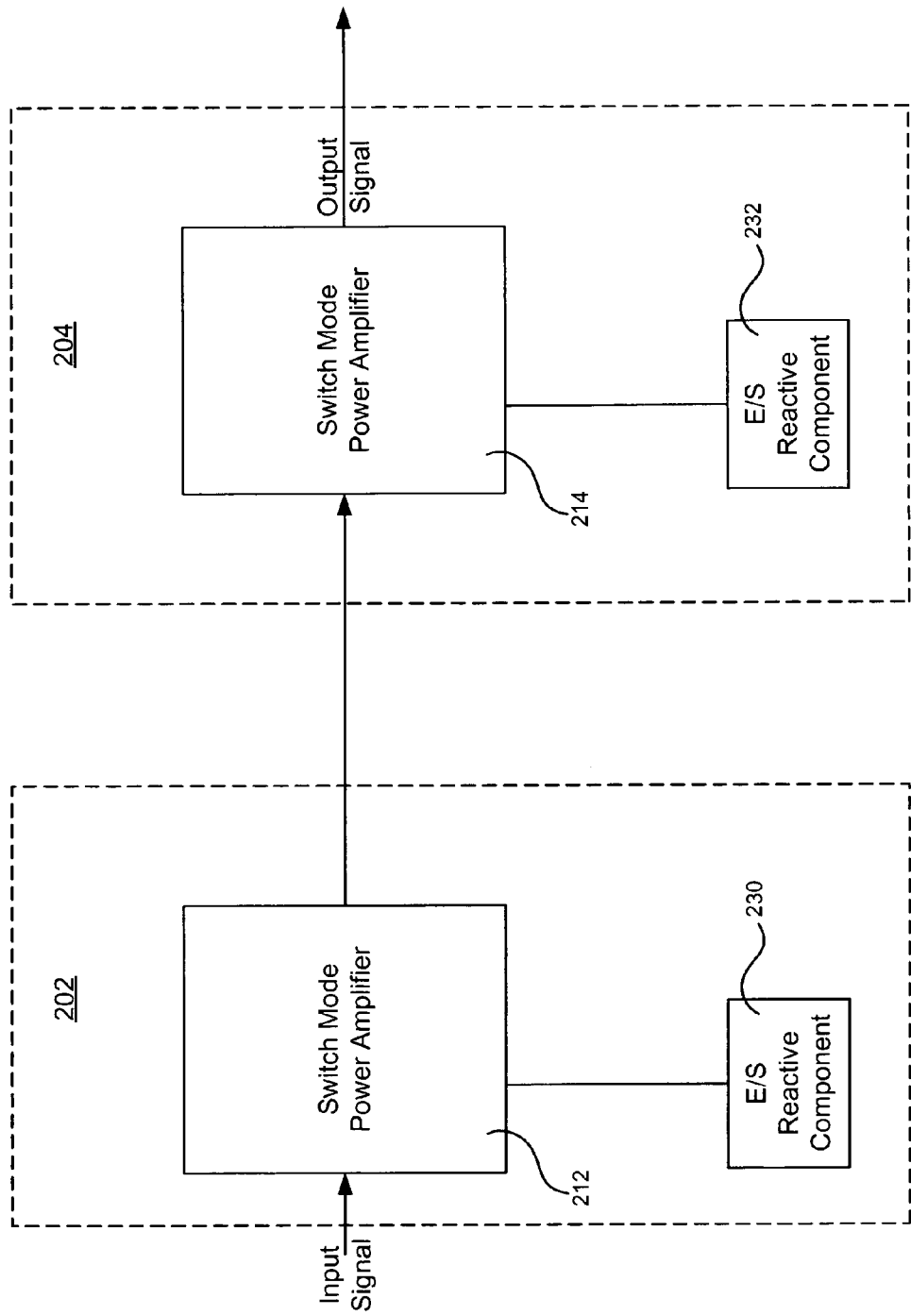
FIG. 2 is a block diagram of one embodiment of a SMPA.

FIG. 2 is a block diagram of one embodiment of an IPE SMPA. The IPE SMPA of FIG. 2 is a multi-stage IPE SMPA embodiment. As shown in FIG. 2, IPE SMPA 200 includes first IPE SMPA 202 and second IPE SMPA 204. First IPE SMPA 202 is operatively coupled to second IPE SMPA 204. First IPE SMPA 202 (i.e., a first stage) receives an input signal and transmits an amplified signal to second IPE SMPA 204 (i.e., a second stage). Second IPE SMPA 204 receives the amplified signal and transmits an output signal.

As shown in FIG. 2, first IPE SMPA 202 includes first SMPA 212 and first E/S reactive component 230. First SMPA 212 is operatively coupled to first E/S reactive component 230, which is fabricated or selected to produce a desired E/S degeneration reactive component value for first IPE SMPA 202. Second IPE SMPA 204 includes second SMPA 214 and second E/S reactive component 232. Second SMPA 214 is operatively coupled to second E/S reactive component 232, which is fabricated or selected to produce a desired E/S degeneration reactive component value for second IPE SMPA 204. Those of ordinary skill in the art shall recognize that other embodiments of multi-stage IPE SMPA can be configured without departing from the scope or spirit of the multi-stage IPE SMPA.

Figure 3:
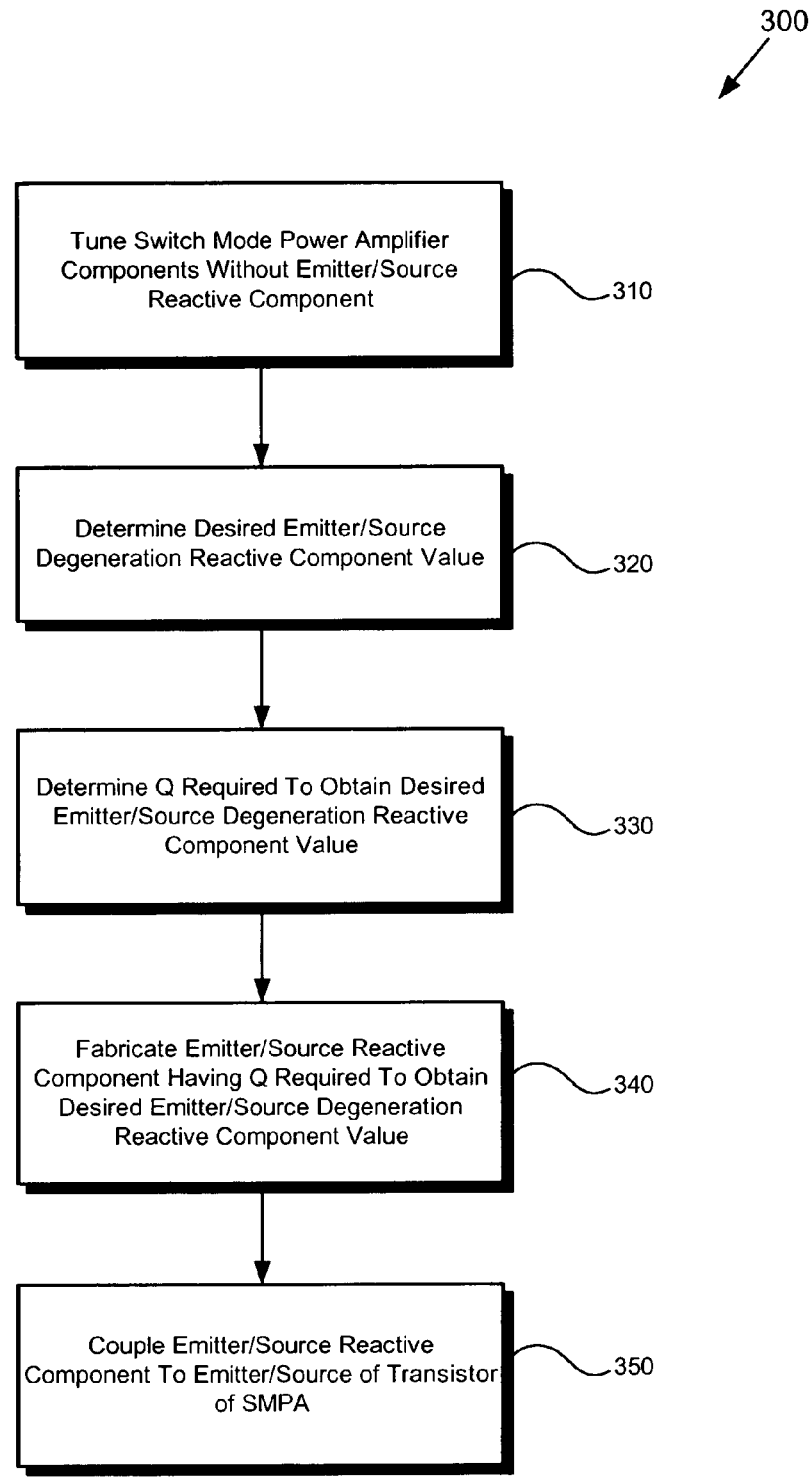
FIG. 3 is a flowchart of an exemplary method of one embodiment of a SMPA.

FIG. 3 is a flowchart illustrating exemplary process steps taken to implement an exemplary IPE SMPA. Certain details and features have been left out of flowchart 300 of FIG. 3 that are apparent to a person of ordinary skill in the art. For example, a step may consist of one or more sub-steps or may involve specialized equipment or materials, as known in the art. While STEPS 310 through 340 shown in flowchart 300 are sufficient to describe one embodiment of the IPE SMPA, other embodiments of the IPE SMPA may utilize steps different from those shown in flowchart 300.

Referring to FIG. 3, at STEP 310 in flowchart 300, the method tunes a switching mode power amplifier without an emitter/source reactive component (i.e., an E/S reactive component is not coupled to the SMPA). After STEP 310, the method proceeds to STEP 320. At STEP 320 in flowchart 300, the method determines a desired E/S degeneration reactive component value (to provide increased power efficiency). In one embodiment, the method determines the desired E/S degeneration reactive component value by empirical methods. In one embodiment, the method determines the desired E/S degeneration reactive component value by computational methods. After STEP 320, the method proceeds to STEP 330. At STEP 330 in flowchart 300, the method determines a Q value required to obtain the desired E/S degeneration reactive component value. After STEP 330, the method proceeds to STEP 340. At STEP 340 in flowchart 300, the method fabricates an E/S reactive component having a Q value required to obtain the desired E/S degeneration reactive component value. In one embodiment, the method at STEP 340 selects an E/S reactive component having the Q value required to obtain the desired E/S degeneration reactive component value. After STEP 340, the method proceeds to STEP 350. At STEP 350 in flowchart 300, the method couples the E/S reactive component of STEP 340 to an E/S of a transistor in a SMPA. The method terminates at STEP 350.

From the above description, it is manifest that various techniques can be used for implementing the concepts without departing from their scope. Moreover, a person of ordinary skill in the art would recognize that changes can be made in form and detail without departing from the spirit and the scope. The described embodiments are to be considered in all respects as illustrative and not restrictive. It should also be understood that the particular embodiments described herein are capable of many rearrangements, modifications, and substitutions without departing from the scope and spirit.

We claim:

1. An increased power efficient switching mode power amplifier system, comprising:
  a) a SMPA, comprising:
    i) a transistor having an emitter/source, capable of receiving an input signal, capable of transmitting said input signal;
    ii) an RF choke, operatively coupled to said transistor, capable of providing said SMPA with a relatively constant current across a frequency cycle;
    iii) a tank circuit, operatively coupled to said RF choke and said transistor, capable of receiving said input signal, capable of providing a resonant filtering function, capable of transmitting an output signal;
  b) an E/S reactive component comprising a parallel combination of inductors and capacitors, operatively coupled to said emitter/source of said transistor of said SMPA, having a desired E/S degeneration reactive component value.

2. The system of claim 1, wherein said transistor comprises a bipolar transistor, and wherein said E/S reactive component is operatively coupled to an emitter of said bipolar transistor.

3. The system of claim 1, wherein said transistor comprises a uni-polar transistor, and wherein said E/S reactive component is operatively coupled to a source of said bipolar transistor.

4. The system of claim 1, wherein said E/S reactive component is operatively coupled to a negative power supply terminal.

5. The system of claim 1, further comprising a second stage, operatively coupled to said SMPA, capable of receiving an amplified signal from said SMPA and transmitting a second stage output signal.

6. The system of claim 1, wherein said second stage comprises a second SMPA and a second E/S reactive component, wherein said second SMPA is operatively coupled to said second E/S reactive component.

7. An increased power efficient switching mode power amplifier system, comprising:
  a. a SMPA, comprising:
    i. a transistor having an emitter/source, capable of receiving an input signal, capable of transmitting said input signal;
    ii. an RF choke, operatively coupled to said transistor, capable of providing said SMPA with a relatively constant current across a frequency cycle;
    iii. a tank circuit, operatively coupled to said RF choke and said transistor, capable of receiving said input signal, capable of providing a resonant filtering function, capable of transmitting an output signal;
  b. an E/S reactive component comprising a complex impedance fabricated to increase SMPA power efficiency, operatively coupled to said emitter/source of said transistor of said SMPA, having a desired E/S degeneration reactive component value.

8. The system of claim 7, wherein said transistor comprises a bipolar transistor, and wherein said E/S reactive component is operatively coupled to an emitter of said bipolar transistor.

9. The system of claim 7, wherein said transistor comprises a uni-polar transistor, and wherein said E/S reactive component is operatively coupled to a source of said bipolar transistor.

10. The system of claim 7, wherein said E/S reactive component is operatively coupled to a negative power supply terminal.

11. The system of claim 7, further comprising a second stage, operatively coupled to said SMPA, capable of receiving an amplified signal from said SMPA and transmitting a second stage output signal.

12. The system of claim 7, wherein said second stage comprises a second SMPA and a second E/S reactive component, wherein said second SMPA is operatively coupled to said second E/S reactive component.

* * * * *